United States Patent
Holzapfel et al.

(10) Patent No.: US 6,727,162 B2
(45) Date of Patent: Apr. 27, 2004

(54) SEMICONDUCTOR CHIP ASSEMBLY SYSTEM WITH A SUCTION NIPPLE FOR REMOVING A SEMICONDUCTOR CHIP

(75) Inventors: Gerhard Holzapfel, Rain (DE); Raimund Schindler, Bad Abbach (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/314,175

(22) Filed: Dec. 6, 2002

(65) Prior Publication Data

US 2003/0108417 A1 Jun. 12, 2003

(30) Foreign Application Priority Data

Dec. 6, 2001 (DE) .......................................... 101 59 974

(51) Int. Cl.[7] .......................... H01L 21/46; H01L 21/78; H01L 21/301
(52) U.S. Cl. ..................................................... 438/464
(58) Field of Search .......................................... 438/464

(56) References Cited

U.S. PATENT DOCUMENTS 6,139,676 A  * 10/2000 Fernandez ................... 438/464
6,648,215 B2 * 11/2003 Leu ......................... 228/248.1

FOREIGN PATENT DOCUMENTS

DE  44 30 381 C2  3/1995

\* cited by examiner

*Primary Examiner*—Cuong Nguyen
(74) *Attorney, Agent, or Firm*—Laurence A. Greenberg; Werner H. Stemer; Ralph E. Locher

(57) ABSTRACT

A semiconductor chip assembly system has a suction nipple for picking up a semiconductor chip from a carrier film. For this purpose, the suction nipple has a dimensionally stable cylindrical mouthpiece with a suction bore. The mouthpiece is adjoined by a rubber-elastic region of the suction nipple and goes over into a dimensionally stable suction tube attachment of the suction nipple.

18 Claims, 5 Drawing Sheets

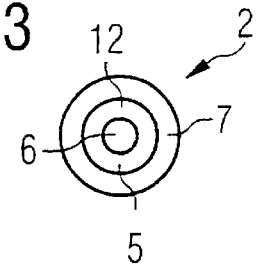
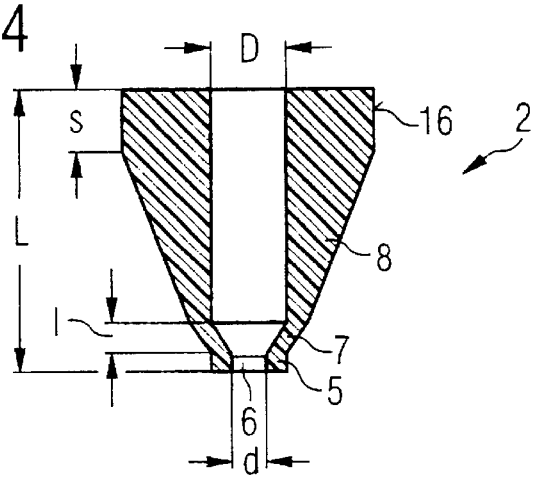
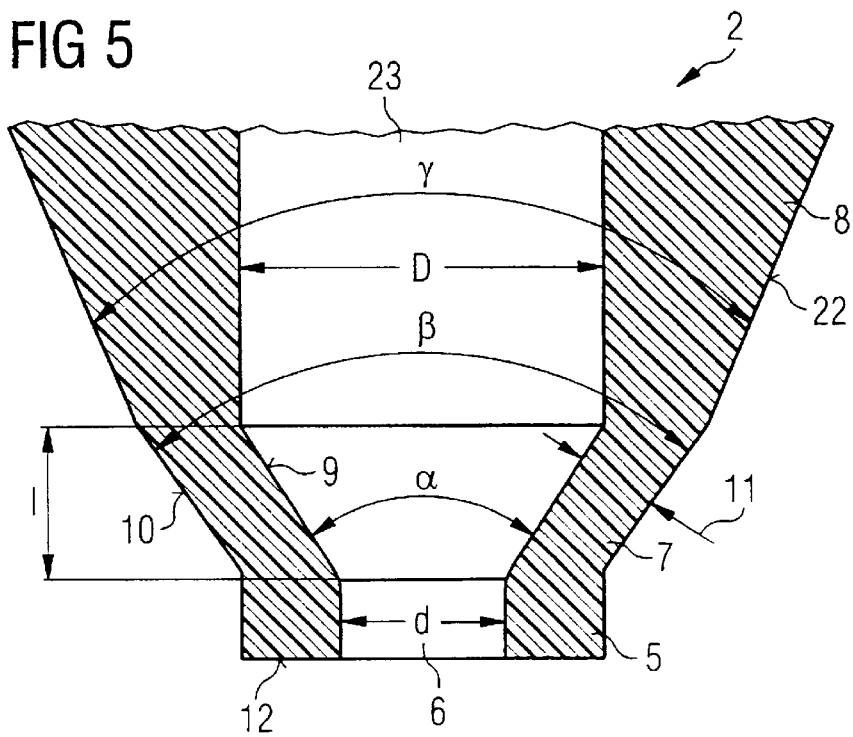

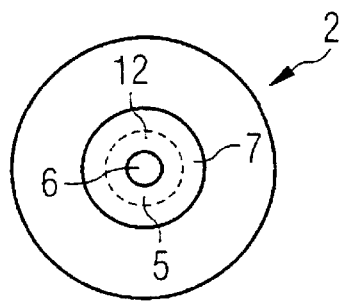
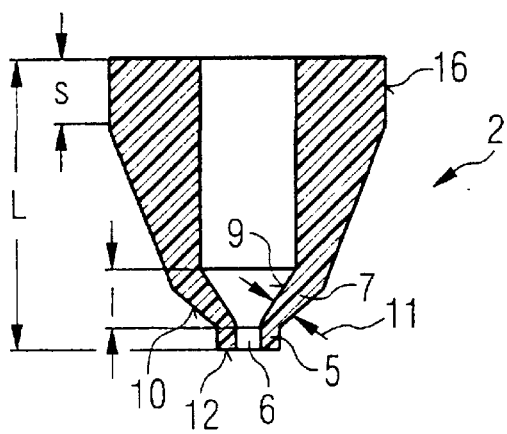
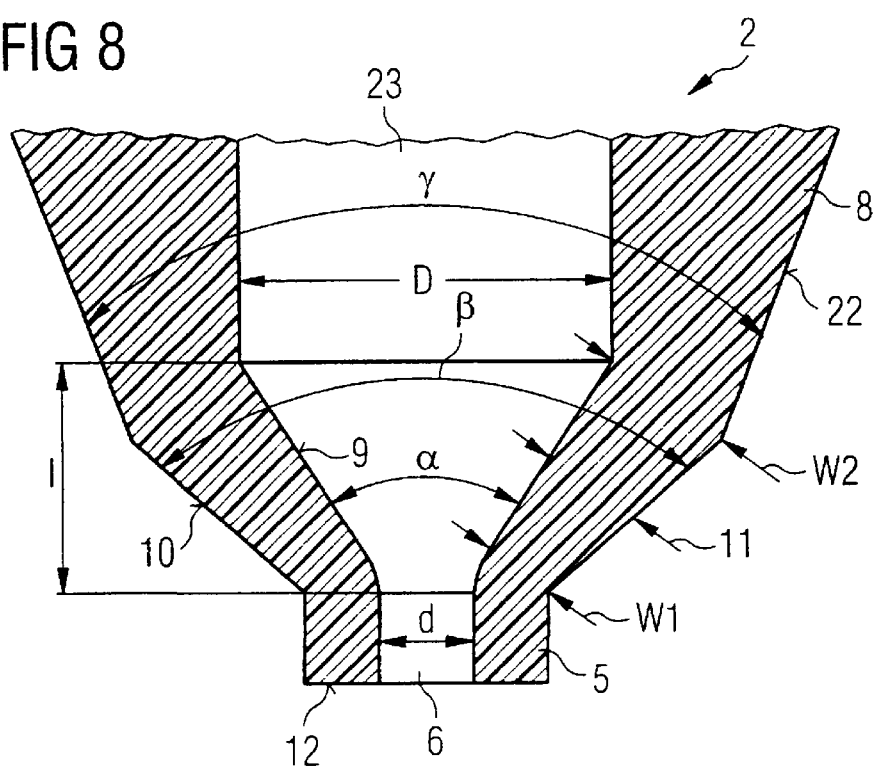

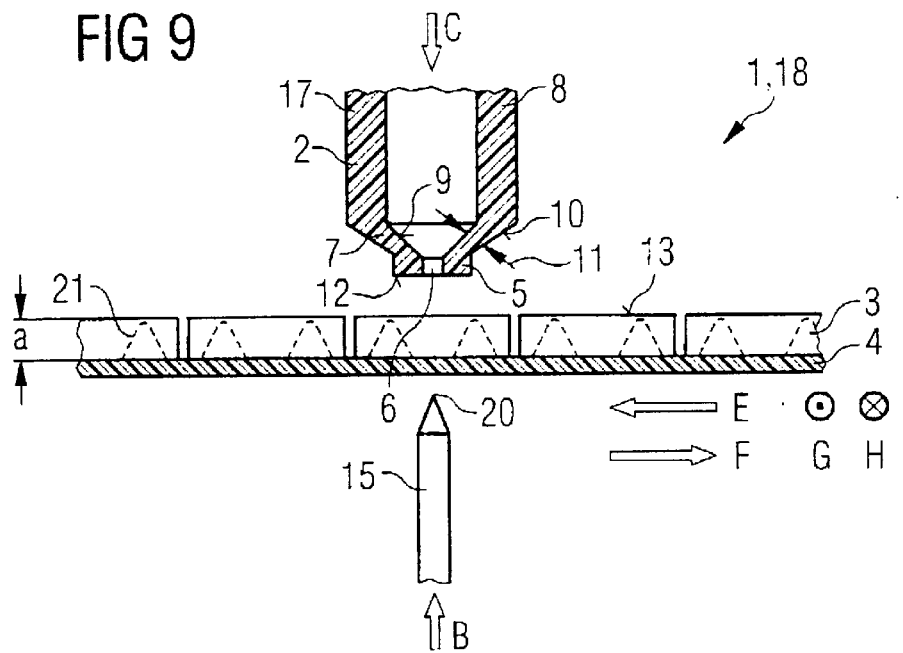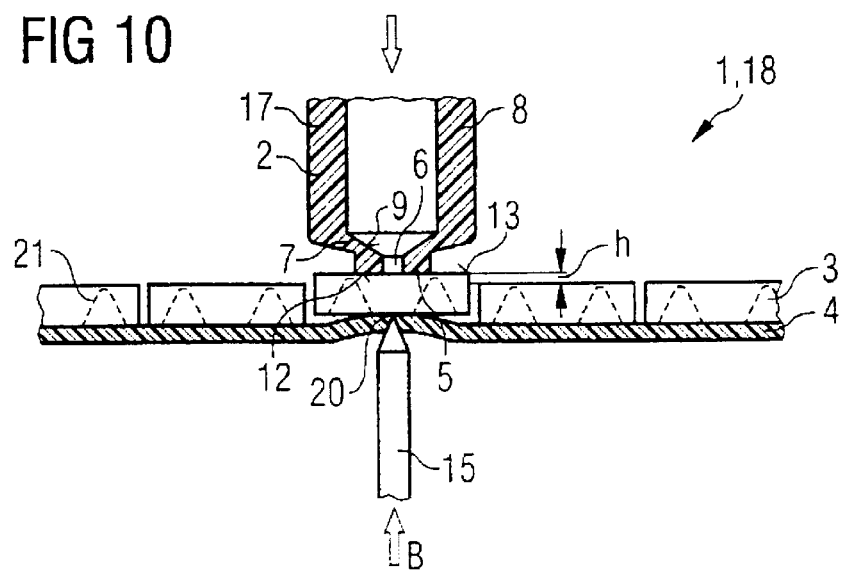

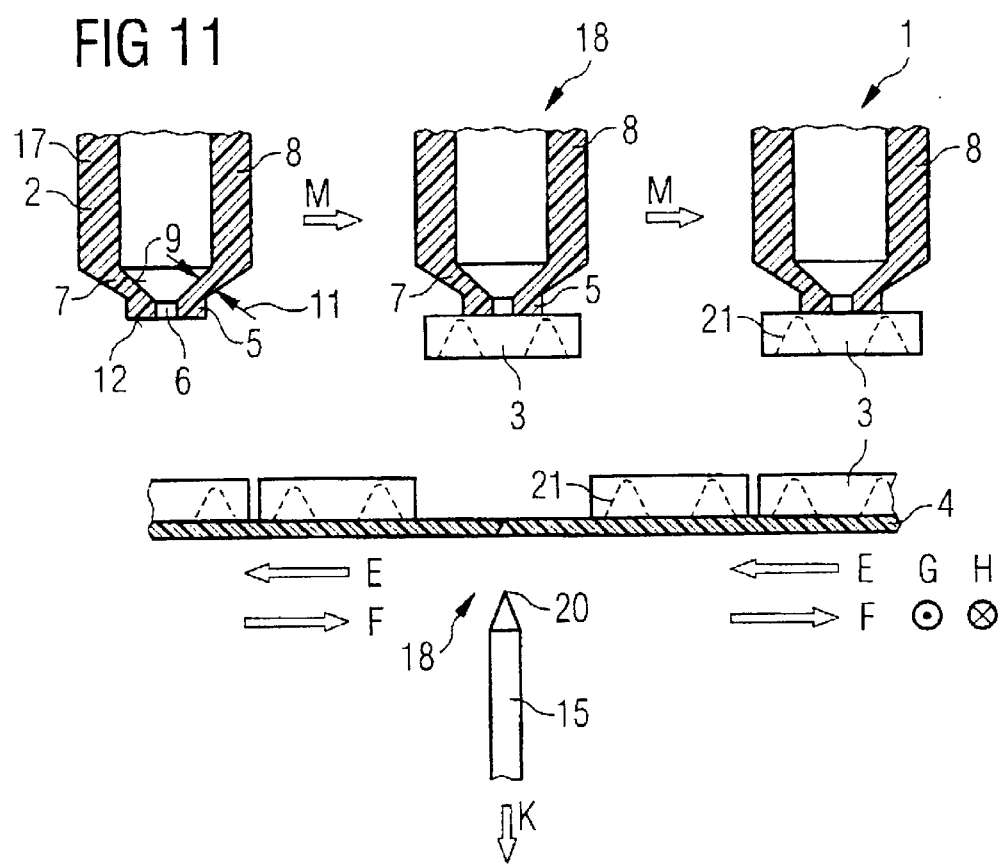

SEMICONDUCTOR CHIP ASSEMBLY SYSTEM WITH A SUCTION NIPPLE FOR REMOVING A SEMICONDUCTOR CHIP

BACKGROUND OF THE INVENTION

Field of the Invention

The invention relates to a semiconductor chip assembly system with a suction nipple for removing a semiconductor chip from a carrier film and for positioning and setting down the semiconductor chip in a component position of a lead frame for electronic components.

With increasing miniaturization of semiconductor chips, in particular with increasing reduction of the volume of the semiconductor chips by reducing the thickness of the semiconductor chips by etching or grinding them thin, to a thickness of only a few tenths of micrometers, the handling of semiconductor chips in a semiconductor chip assembly system is becoming increasingly more difficult. At present, the failure rate when using standard handling tools in a semiconductor chip assembly system is already approximately 20%. With such a high proportion of damaged miniaturized semiconductor chips, in particular in the case of semiconductor chips intended for radio-frequency applications, it is necessary to reduce the failure rate. Particularly high failure rates occur in semiconductor chip assembly systems that are used for "die bonding". In this case, the semiconductor chip is removed from a carrier film that is adhesive on one side and brought into a position in which the semiconductor chip is fixed on a chip island of a lead frame in a component position for producing an electronic component.

SUMMARY OF THE INVENTION

It is accordingly an object of the invention to provide a semiconductor chip assembly system with a suction nipple for removing a semiconductor chip that overcomes the above-mentioned disadvantages of the prior art devices of this general type, with which the failure rate in the handling and transporting of the semiconductor chip within the semiconductor chip assembly system is reduced.

With the foregoing and other objects in view there is provided, in accordance with the invention, a semiconductor chip assembly system. The system contains a suction nipple for removing a semiconductor chip from a carrier film and for positioning and setting down the semiconductor chip in a component position of a lead frame for electronic components. The suction nipple includes a dimensionally stable cylindrical mouthpiece with a suction bore formed therein, a rubber-elastic region adjoining the cylindrical mouthpiece, and a dimensionally stable suction tube attachment extending from the rubber-elastic region.

According to the invention, a semiconductor chip assembly system is provided, which system is equipped with a suction nipple for picking up a semiconductor chip from a carrier film and at the same time holds the semiconductor chip for positioning it and setting it down in a component position of a lead frame for electronic components. For this purpose, the suction nipple has a dimensionally stable cylindrical mouthpiece with a suction bore, which is adjoined by a rubber-elastic region of the suction nipple which goes over into a dimensionally stable suction tube attachment.

When a suction nipple is used in a semiconductor chip assembly system, it is under vacuum as soon as a surface of the semiconductor chip closes its suction opening. The dimensionally stable configuration of a cylindrical mouthpiece has the effect of ensuring that the mouthpiece does not collapse, deform or in some other way damage or lose the semiconductor chip during the manipulation within the semiconductor chip assembly system. What is more, the dimensionally stable cylindrical mouthpiece has the effect of ensuring that the surface of the semiconductor chip can support itself on a dimensionally stable surface of the cylindrical mouthpiece.

The rubber-elastic region of the suction nipple adjoining the mouthpiece allows the nipple to adapt itself to the position of the upper side of the semiconductor chip without exerting damaging pressure on the semiconductor chip. Rather, the mouthpiece is rubber-elastically cushioned and can consequently be set down gently on the surface of the semiconductor chip. The adjoining dimensionally stable suction tube attachment of the suction nipple ensures that the suction tube attachment of the suction nipple can be connected in a gastight manner to a corresponding vacuum tube or a vacuum line. In this case, the dimensionally stable suction tube attachment supplies the rubber-elastic region and the dimensionally stable cylindrical mouthpiece of the suction nipple with a vacuum during operation, without itself collapsing and consequently putting at risk the secure holding of the semiconductor chip.

The inside diameter of the suction tube attachment is many times greater than the suction bore of the cylindrical mouthpiece. The rubber-elastic region consequently forms the transition from the suction bore to the many times greater diameter of the suction tube attachment. For this purpose, the rubber-elastic region has an inner cone and an outer cone, which between them has a thin rubber-elastic wall. The configuration of the inner cone and outer cone allows the elasticity of the rubber-elastic region to be varied and set to the requirements of the semiconductor chip assembly system for miniaturized semiconductor chips. The choice of the same slope of the inner cone and outer cone allows a constant wall thickness of a rubber-elastic material from the suction tube attachment to the mouthpiece to be realized. The wall thickness itself may in this case be made to match very precisely the loading capability of the semiconductor chips to be held.

To achieve decreasing elasticity of the rubber-elastic region with increasing deformation of the rubber-elastic region, this region may have between the inner cone and the outer cone a wall thickness of a rubber-elastic material that becomes thinner toward the mouthpiece. If there is slight deflection of the cylindrical mouthpiece in the axial direction, consequently a high rubber-elasticity is initially provided, decreasing as the degree of deformation of the rubber-elastic region increases. With such a configuration of the suction nipple, the deformation resistance becomes greater as the deformation of the rubber-elastic region of the suction nipple increases.

The size of the rubber-elastic region is substantially determined by the area ratio between the cross section of the suction bore of the mouthpiece and the inner cross section of the suction tube attachment. To achieve effective cushioning by the rubber-elastic region of the cylindrical mouthpiece, this area ratio lies between 1:9 and 1:16.

Apart from the area ratio, the length of the rubber-elastic region in the axial direction is decisive for the elasticity of the region. The greater the length, the more rigid the rubber-elastic region becomes in the axial direction. A preferred ratio between the length of the rubber-elastic region in the axial direction in relation to the inside diameter of the suction tube attachment lies between 1:2 and 1:4. The smaller the ratio becomes, the softer and more elastic the rubber-elastic region will act. However, if the ratio goes below 1:4, the risk increases of the vacuum within the suction tube attachment alone causing the dimensionally stable mouthpiece to be inverted into the interior space of the suction tube attachment and the suction nipple consequently no longer being serviceable.

The ratio of the length of the rubber-elastic region in the axial direction to the diameter of the suction bore of the mouthpiece should also not exceed a range from 1:1 to 3:1. Here, too, outside this range there is, on the one hand, a risk of the rubber-elastic region becoming rigid and, in the opposite direction, the risk of the mouthpiece being inverted into the interior space of the suction tube attachment.

To ensure the dimensional stability of the cylindrical mouthpiece and of the suction tube attachment in comparison with the rubber-elastic region, the wall thickness of the rubber-elastic region may be less than or equal to the wall thickness of the cylindrical mouthpiece and, in any event, less than the wall thickness of the suction tube attachment. If these conditions are maintained, it can be assumed that the requirements to be met by the individual regions of the suction nipple when picking up a semiconductor chip are satisfied.

Diameters between 100 and 500 $\mu$m have proven to be optimal for the suction tube bore and sizes between 250 and 1200 micrometers have proven to be optimal as the outside diameter of the cylindrical mouthpiece. In contrast, the inside diameter of the suction tube attachment should lie between 800 and 1200 micrometers.

The transition from the suction tube attachment of the suction nipple to a vacuum tube or a vacuum line in the semiconductor chip assembly system can be ensured by an outer plug cone of the suction tube attachment, with which the suction nipple can be fitted in a vacuumtight manner into a suction tube or a vacuum line. This has the advantage of quick and easy exchangeability of the suction nipple, which has a limited service life on account of its sensitive mouthpiece and the no less sensitive rubber-elastic region.

To place the mouthpiece onto the surface of a semiconductor chip in a plane-parallel manner, the mouthpiece has a disk-shaped suction mouth. The disk-shaped suction mouth is highly polished and planar, to establish a connection that is as vacuumtight as possible between the surface of the semiconductor chip and the disk-shaped suction mouth. It is even possible to compensate for inclinations of the surface of the semiconductor chip, because according to the invention the dimensionally stable mouthpiece is adjoined by a rubber-elastic region that compensates for angles of inclination of the surface of the semiconductor chip with respect to the surface of the disk-shaped suction mouth.

For this compensation and for the operation of lifting a semiconductor chip off a carrier film that is adhesive on one side, it is provided that the rubber-elastic excursion in the axial direction of the mouthpiece on account of the rubber-elastic region of the suction nipple can be up to 1000 $\mu$m. Such a great rubber-elastic excursion in comparison with the thickness of the chip ensures that the dimensionally stable mouthpiece with its suction opening does not cause any damage when it is placed onto the surface of the semiconductor chip. Furthermore, the rubber-elastic excursion ensures that the raising of the semiconductor chip by a lifting needle from the rear side of the semiconductor chip does not lead to the upper side of the semiconductor chip becoming damaged by the dimensionally stable mouthpiece of the suction nipple. In such a semiconductor chip assembly system, the lifting needle itself is an auxiliary tool with which, on the one hand, the film on the rear side of the semiconductor chip is pierced and, on the other hand, the semiconductor chip is centrally raised and detached from the layer of adhesive of the film and lifted against the dimensionally stable mouthpiece of the suction nipple. The suction nipple according to the invention consequently ensures a rubber-elastic excursion that cushions the raising by the lifting needle from the rear side of the semiconductor chip on the upper side of the semiconductor chip and consequently reduces damage to the semiconductor chip.

The suction nipple may be produced in one piece with its suction tube attachment, its rubber-elastic region and its mouthpiece from a plastic injection-molding compound. In the case of such a one-piece embodiment, the dimensional stability of the mouthpiece and the dimensional stability of the suction tube attachment are ensured by corresponding wall thicknesses both of the mouthpiece and of the suction tube attachment. Although, as a result, the regions of the suction nipple with thick walls likewise have rubber-elastic properties, considerably higher forces would be required for deforming these regions than for the region of the suction nipple that, by appropriately thin walls in comparison with the dimensionally stable region, has correspondingly higher elasticity.

Such a suction nipple may be produced from an elastomeric plastic. Elastomeric plastics have the advantage that they recover their basic shape even under extreme deformation. Consequently, the rubber-elastic region itself will go back into its original position even in the case of the extreme rubber-elastic excursion of 1000 $\mu$m, if the entire suction nipple is produced from an elastomeric plastic.

As a one-piece component, the suction nipple may contain a thermoplastic rubber of a mixture of polypropylene and olefins. Such a mixture has the advantage over other types of rubber that it is particularly tear-resistant and has high impact strength. This increases the service life and serviceability of the suction nipple in comparison with suction nipples made of other elastomers.

To sum up, it can be stated that the special configuration of the "die-bonding tool" allows mechanical and electrical damage to the semiconductor chip to be avoided. In addition, it has been found that the embodiment of the suction nipple proposed in this invention can be produced at lower cost by a factor of 100 than known variants. The special configuration of the suction nipple or of the "die-bonding tool" together with the aforementioned material selection allows damping properties and elastic properties of the material to be deliberately used to ensure gentle handling of the semiconductor chips in the semiconductor chip assembly system according to the invention.

During the "pickup", that is the lifting of the semiconductor chip off a wafer sawn into semiconductor chips on a carrier film that is adhesive on one side, the "tool" moves with the suction nipple onto the surface of the chip. As this takes place, a specifically intended deformation of the lower part of the tool occurs, and is used for damping, or the damped placement, of the tool onto the surface of the chip. After removal of a chip by the tool, the deformation reverts to the original shape again. The material selection in the form of a thermoplastic rubber results in that the service life of the tool is not adversely affected. Even semiconductor chips that are weakened by "via holes" can be assembled unimpaired and undamaged in the semiconductor chip assembly system. Even chips which have been etched thin and the thickness of which is below 100 μm can be processed unimpaired with this semiconductor chip assembly system. It has been possible to demonstrate that, by using the semiconductor chip assembly system with a suction nipple which has a rubber-elastic region, the failure rate in "die bonding" can be reduced to a few individual chips, with the result that the yield can be increased by almost 20%.

In accordance with a concomitant feature of the invention, a lifting needle is disposed opposite the cylindrical mouthpiece for removing the semiconductor chips from a carrier film. The lifting needle has a lifting range which ensures piercing of the carrier film and the lifting of the semiconductor chip off the carrier film and the holding of the semiconductor chip against the cylindrical mouthpiece of the suction nipple.

Other features which are considered as characteristic for the invention are set forth in the appended claims.

Although the invention is illustrated and described herein as embodied in a semiconductor chip assembly system with a suction nipple for removing a semiconductor chip, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a bottom, plan view of a cylindrical mouthpiece of the suction nipple of an embodiment of the invention;

FIG. 4 is a cross-sectional view through the suction nipple with the mouthpiece of the embodiment shown in FIG. 3;

FIG. 5 is an enlarged cross-sectional view of the suction nipple shown in FIG. 4;

FIG. 6 is a bottom, plan view of a mouthpiece of a suction nipple of a further embodiment of the invention;

FIG. 7 is a cross-sectional view of the suction nipple with a mouthpiece of the embodiment shown in FIG. 6;

FIG. 8 is an enlarged, cross-sectional view of the suction nipple shown in FIG. 7;

FIG. 9 is a cross-sectional view of an aligned tool with the suction nipple at a removal position of the semiconductor chip assembly system;

FIG. 10 is a cross-sectional view of the tool with the suction nipple during the lifting of the semiconductor chip off a carrier film in the removal position of the semiconductor chip assembly system; and FIG. 11 is a sectional view showing a basic transporting of a carrier film loaded with semiconductor chips into the removal position and the transporting of the tool with removed semiconductor chips from the removal position.

DESCRIPTION OF THE PREFERRED EMBODIMENTS

Figure 1:
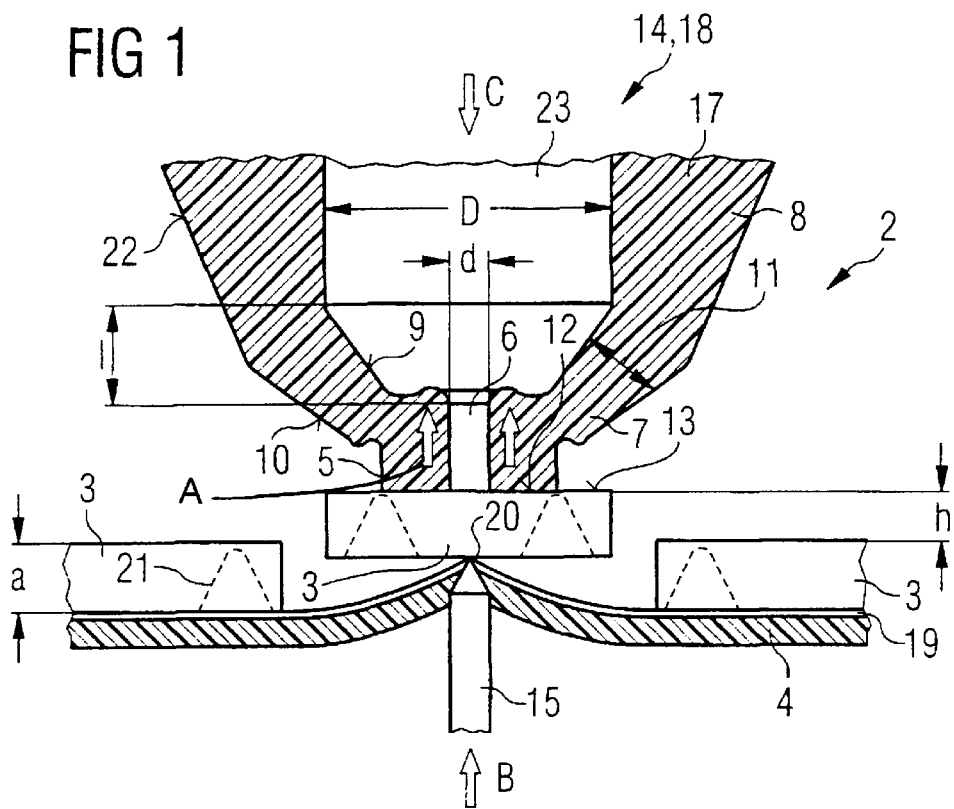
FIG. 1 is a diagrammatic, cross-sectional view of a removal device of a semiconductor chip assembly system for removing semiconductor chips from a carrier film with a suction nipple according to the invention.

Referring now to the figures of the drawing in detail and first, particularly, to FIG. 1 thereof, there is shown a diagrammatic, cross-sectional view of a removal device 14 of a semiconductor chip assembly system 1 for removing a semiconductor chip 3 from a carrier film 4 with a suction nipple 2. The suction nipple 2 has for this purpose three regions: a dimensionally stable mouthpiece 5 with a suction bore 6, a rubber-elastic region 7 and a dimensionally stable suction tube attachment 8.

The reference numeral 9 identifies an inner cone of the rubber-elastic region 7 of the suction nipple 2. The reference numeral 10 identifies an outer cone of the rubber-elastic region 7 of the suction nipple 2. Between the inner cone 9 and the outer cone 10 there is a wall thickness 11 of the rubber-elastic region 7. In the embodiment shown in FIG. 1, the wall thickness 11 decreases in a direction of the mouthpiece 5. In the rubber-elastic region 7 of the suction nipple 2, the rubber-elastic region 7 is easily deformable in a direction of the dimensionally stable suction tube attachment 8, in a direction of the arrow A, as soon as a semiconductor chip 3 is brought with its upper side 13 against a suction mouth 12 of the mouthpiece 5.

A lifting needle 15, which in a removal position 18 is inserted from below through a carrier film 4 in a direction of an arrow B. As this takes place, one of the semiconductor chips 3, which are fixed on the carrier film 4 by a layer of adhesive 19 and belonged to a sawn semiconductor wafer, is raised in the removal position 18 by a tip 20 of the lifting needle 15. This lift may be up to 1000 μm. The lift distance h is exaggerated in this diagrammatic representation, in order to demonstrate the functional principle of the lifting needle 15.

During the raising of the semiconductor chip 3 by the lifting needle 15 in the direction B by the lift distance h, the suction mouth 12 disposed above the semiconductor chip 3 moves with the dimensionally stable mouthpiece 5 in the direction A, with the rubber-elastic region 7 of the suction nipple 2 deforming. The rubber-elastic effect of the rubber-elastic region 7 allows the suction nipple 2 to yield as the lifting needle 15 is moved up in the direction B and gently pick up the sensitive semiconductor chip 3 by its upper side 13. At the same time, the semiconductor chip 3 is lifted off the layer of the adhesive 19 of the carrier film 4 by the lifting movement of the lifting needle 15. The lifting off from the layer of adhesive 19 takes place so gently that even semiconductor chips 3 which have been ground thin, with a thickness a of below 100 μm, can be lifted gently off the film 4 and the layer of adhesive 19.

The semiconductor chips 3 shown in FIG. 1 are additionally weakened on account of having contact vias 21 etched in and produced from the rear side. In spite of these weakened and miniaturized semiconductor chips 3, it has been possible to improve the handling in the semiconductor chip assembly system with such a suction nipple 2 to such an extent that an approximately 20% improvement in the yield is achieved.

Figure 2:
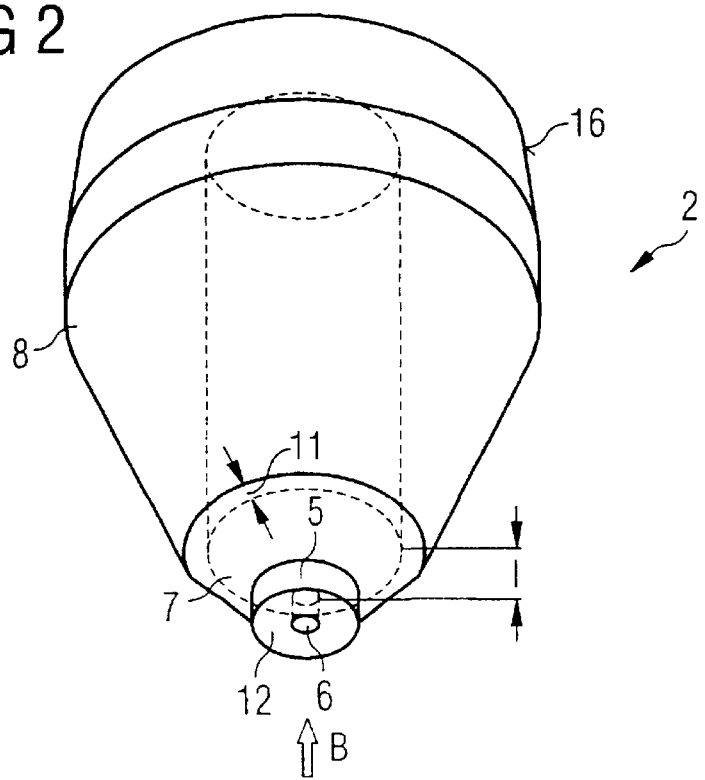
FIG. 2 is a perspective view of the suction nipple.

FIG. 2 shows a schematic perspective view of the suction nipple 2. Components with the same functions as in FIG. 1 are identified by the same reference numerals and are not separately explained.

FIG. 2 shows the suction nipple 2 in the relieved state, so that the rubber-elastic region 7 is not bulging inward in the same way as in FIG. 1. Although the suction nipple 2 is produced in one piece from a rubber-elastic material, the material thickness of the mouthpiece 5 results in that it remains dimensionally stable under loading. Consequently, the suction mouth 12 also remains planar and can align itself to be plane-parallel to the surface of a semiconductor chip 3 to be removed, held and transported. The plane-parallel alignment of the suction mouth 12 is assisted by the rubber-elastic region 7, so that the mouthpiece 5 with its suction opening 6 and the suction mouth 12 can also adapt itself to inclinations of the upper side 13 of a semiconductor chip 3.

The wall thickness 11 is also much less than the wall thickness in a region of the suction tube attachment 8. The wall thickness in the region of the suction tube attachment 8 initially increases and ends in an outer plug cone 16, with which the suction tube attachment 8, and consequently the suction nipple 2, can be fitted in a gastight manner into a vacuum line or a vacuum tube. An axial length l in the rubber-elastic region 7 is not much greater than the possible lift distance h by which the suction mouth 12 can be moved in the direction B.

FIG. 3 shows a diagrammatic view from below of the cylindrical mouthpiece 5 of the suction nipple 2 of an embodiment of the invention. Components with the same functions as in the previous figures are identified by the same reference numerals and are not separately explained.

The suction bore 6 in the embodiment of FIG. 3 has a diameter of 300 μm. The mouthpiece 5 has with its suction mouth 12 has a circumference of 800 μm. This region of the mouthpiece 5 is adjoined by the conical rubber-elastic region 7.

FIG. 4 shows a diagrammatic, cross-sectional view of the suction nipple 2 with the mouthpiece 5 of the embodiment of FIG. 3. An overall axial length L of the suction nipple 2 is greater by a factor of 10 than the axial length l of the rubber-elastic region 7 of the suction nipple 2. An axial length s of the outer plug cone 16 corresponds approximately to twice the axial length l of the rubber-elastic region 7. A sealing area, which is created by the outer plug cone 16, is adequate to connect the suction nipple 2 reliably to a vacuum tube or vacuum line.

FIG. 5 shows an enlarged cross section of the suction nipple 2 shown in FIG. 4. In this case, the suction opening 6 has a diameter d of 300 μm, while an inside diameter D of the suction tube attachment 8 is a multiple of the diameter d of the suction opening 6. In this embodiment, the area ratio between the cross section of the suction bore 6 of the mouthpiece 5 and the inner cross section of the suction tube attachment 8 lies between 1:9 and 1:16. The shape and cross section of the rubber-elastic region 7 is substantially determined by the inner cone 9 and the outer cone 10. In this embodiment, an apex angle α of the inner cone 9 and an apex angle β of the outer cone 10 are the same. This produces a uniform wall thickness 11 for the rubber-elastic region 7 of the suction nipple 2. The rubber-elastic region 7 goes over into the suction tube attachment 8, which has a constant inside diameter D and a conically widening outer casing 22. An apex angle γ of the outer casing 22 is somewhat less than the apex angle of the outer cone 10 of the rubber-elastic region 7.

The conically extending outer casing 22 of the suction tube attachment 8 has the effect of ensuring that the suction tube attachment 8 remains dimensionally stable and does not collapse when a vacuum is applied. The mouthpiece 5 is also dimensioned in such a way that it does not contract or deform when a vacuum is applied to an inner bore 23 of the suction tube attachment 8, and consequently to the suction bore 6.

FIG. 6 shows a view from below of the mouthpiece 5 of the suction nipple 2 of a further embodiment of the invention. Components with the same functions as in the previous figures are identified by the same reference numerals and are not separately explained.

In this embodiment of the invention, the suction bore 6 has a diameter of 200 μm, while the outer rim of the suction mouth 12, and consequently of the mouthpiece 5, has a diameter of 1200 μm. This relatively large suction mouth area distributes the loading over a larger region of the semiconductor chip and ensures that damage during the handling of the semiconductor chips is minimized.

FIG. 7 shows a diagrammatic, cross section of the suction nipple 2 with the mouthpiece 5 of the embodiment according to FIG. 6. In this embodiment, too, the overall length L of the suction nipple 2 is a multiple of the length l of the rubber-elastic region 7. In this basic diagram of FIG. 7 it is shown that the inner cone 9 of the rubber-elastic region 7 has a smaller apex angle than the outer cone 10. This is a difference from the embodiment as shown in FIGS. 3, 4 and 5.

FIG. 8 shows an enlarged cross section of the suction nipple 2 of FIG. 7. The apex angle α of the inner cone 9 in the rubber-elastic region 7 is less than the apex angle β of the outer cone 10 in the rubber-elastic region 7. As a result, the wall thickness 11 in the rubber-elastic region 7 becomes thinner from a larger wall thickness w2 at the transition to the suction tube attachment 8 to a smaller wall thickness w1 at the transition to the mouthpiece 5 of the suction nipple 2. This configuration of the wall thickness achieves the effect that, with increasing lift distance h of the mouthpiece 5, the restoring force of the rubber-elastic region 7 increases in a nonlinear manner. Furthermore, it rules out collapsing of the rubber-elastic region 7. The ratio of the length l of the rubber-elastic region 7 in the axial direction in relation to the inside diameter D of the suction tube attachment 8 is decisive for the rubber-elastic properties of the rubber-elastic region 7 and in this embodiment lies between 1:2 and 1:4. The ratio of the length l of the rubber-elastic region 7 in the axial direction in relation to the diameter d of the suction bore 6 of the mouthpiece 5 can also be set optimally to a ratio of 1:1 to 3:1. The axial length of the mouthpiece 5 is in this case less than the axial length l of the rubber-elastic region 7. In the case of such an embodiment of the invention, the inside diameter D of the suction tube attachment 8 lies between 800 and 1200 μm.

The suction nipple 2 depicted in FIG. 8 has been produced in one piece with its suction tube attachment 8, its rubber-elastic region 7 and its mouthpiece 5 from a plastics injection-molding compound. For this purpose, a thermoplastic rubber of a mixture of polypropylene and olefins was used. The suction mouth 12 and its surface are decisive for the holding ability of the suction nipple 2 for semiconductor chips and, on account of the use of the aforementioned materials, can be produced in an extremely planar and channel-free manner by injection-molding without reworking of the surface of the suction mouth.

FIG. 9 shows a diagrammatic, cross section of an aligned tool 17 with the suction nipple 2 at a removal position 18 of a semiconductor chip assembly system 1. The semiconductor chips 3 of a semiconductor wafer have, for this purpose, been applied to the carrier film 4, which is coated on one side with an adhesive. In the removal position 18, the lifting needle 15, which can be raised vertically in the direction of the arrow B, is disposed underneath the carrier film 4. In the removal position 18, the tool 17 can be lowered with the suction nipple 2 in the direction of the arrow C onto the upper side 13 of the semiconductor chip 3. Already during the lowering onto the upper side 13, onto the semiconductor chip 3, the suction mouth 12 of the suction nipple 2 adjusts itself in a plane-parallel manner to conform to the shape of the upper side 13 of the semiconductor chip 3, even if this upper side 13 has an angle of inclination. The conformal shaping and alignment is ensured by the rubber-elastic region 7 of the suction nipple 2.

Compared with the rubber-elastic region 7 of the suction nipple 2, the mouthpiece 5 of the suction nipple 2 is dimensionally stable, and so too is the suction tube attachment 8, so that the rubber-elastic region 7 is disposed between two dimensionally stable regions of the suction nipple 2. The carrier film 4 with the semiconductor chips 3 adhesively attached on it can be moved horizontally in the direction of the arrow E or F, and also in the directions of the arrows G and H, which extend perpendicularly thereto in the horizontal direction. The adjustability of the carrier film 4 allows the semiconductor chips 3, which have previously been sorted in a functional test as serviceable electronic semiconductor chips 3, to be moved into a removal position 18. Due to the miniaturization requirements, the semiconductor chips 3 are extremely sensitive on account of the thickness "a" of below 100 μm and, in addition, are weakened in their strength by corresponding contact vias 21 in their edge regions. The rubber-elastic region 7 of the suction nipple 2 has the effect of ensuring that such sensitive semiconductor chips 3 can be picked up and held, and can be moved for example to a bonding position, without stress.

FIG. 10 shows a diagrammatic, cross section of the tool 17 with the suction nipple 2 during the lifting of the semiconductor chip 3 off the carrier film 4 in the removal position 18 of the semiconductor chip assembly system 1. In the position shown in FIG. 10, the lifting needle 15 has been raised and has pierced the film 4. In this case, the tip of the lifting needle 15 has at the same time lifted the semiconductor chip 3 off the layer of adhesive of the carrier film 4 and held it against the mouthpiece 5 of the suction nipple 2. The minimal lift distance h has the effect that the mouthpiece 5 of the suction nipple 2 is made to bulge in the direction of the suction tube attachment 8. The rubber-elastic region 7 has the effect that little loading of the semiconductor chip 3 occurs during the bulging, guarding the semiconductor chip 3 against damage. When the suction action of the suction nipple 2 commences via the suction bore 6, the semiconductor chip 3 can then be lifted off completely from the separated assembly of a semiconductor wafer.

FIG. 11 shows a basic diagram of the transporting of the carrier film 4 loaded with the semiconductor chips 3 into the removal position 18 and of the tool 17 with the lifted-off semiconductor chip 3 out of the removal position 18. Components with the same functions as in the previous figures are identified by the same reference numerals and are not separately explained.

The lifting needle 15 has been lowered in a direction K, so that the carrier film with the semiconductor chips 3 can be displaced in the directions I, F, G and H until a serviceable semiconductor chip 3 is positioned in the removal position 18. At the same time, the semiconductor chip 3 which has in the meantime been lifted off can be transported with the aid of the tool 17, for example in the direction of the arrow M, to the next processing station of the semiconductor assembly system 1, while the further tool 17 of the same type of construction is already being brought with its suction nipple 2 into the removal position 18. On account of the suction nipple 2 with the rubber-elastic region 7 that has been introduced in this semiconductor chip assembly system 1, it has been possible to reduce considerably the failure rate of minimized, weakened and sensitive semiconductor chips during handling in the semiconductor chip assembly system.

We claim:

1. A semiconductor chip assembly system, comprising:
   a suction nipple for removing a semiconductor chip from a carrier film and for positioning and setting down the semiconductor chip in a component position of a lead frame for electronic components, said suction nipple containing:
      a dimensionally stable cylindrical mouthpiece with a suction bore formed therein;
      a rubber-elastic region adjoining said cylindrical mouthpiece; and
      a dimensionally stable suction tube attachment extending from said rubber-elastic region.

2. The semiconductor chip assembly system according to claim 1, wherein said rubber-elastic region has an inner cone and an outer cone.

3. The semiconductor chip assembly system according to claim 2, wherein said rubber-elastic region has between said inner cone and said outer cone a wall thickness of a rubber-elastic material running constant toward said mouthpiece.

4. The semiconductor chip assembly system according to claim 2, wherein said rubber-elastic region has between said inner cone and said outer cone a wall thickness of a rubber-elastic material becoming thinner toward said mouthpiece.

5. The semiconductor chip assembly system according to claim 1, wherein an area ratio between a cross section of said suction bore of said mouthpiece and an inside cross section of said suction tube attachment is between 1:9 and 1:16.

6. The semiconductor chip assembly system according to claim 1, wherein a ratio of a length of said rubber-elastic region in an axial direction in relation to an inside diameter of said suction tube attachment is 1:2 to 1:4.

7. The semiconductor chip assembly system according to claim 1, wherein a ratio of a length of said rubber-elastic region in an axial direction in relation to a diameter of said suction bore of said mouthpiece is 1:1 to 3:1.

8. The semiconductor chip assembly system according to claim 1, wherein said rubber-elastic region has a wall thickness less than or equal to a thickness of said cylindrical mouthpiece and less than a wall thickness of said suction tube attachment.

9. The semiconductor chip assembly system according to claim 1, wherein said suction bore has a diameter between 100 and 500 micrometers.

10. The semiconductor chip assembly system according to claim 1, wherein said cylindrical mouthpiece has an outside diameter of between 250 and 1000 micrometers.

11. The semiconductor chip assembly system according to claim 1, wherein said suction tube attachment has an inside diameter between 800 and 1200 micrometers.

12. The semiconductor chip assembly system according to claim 1, wherein said cylindrical mouthpiece has a disk-shaped suction mouth to be placed in a plane-parallel manner onto a surface of the semiconductor chip.

13. The semiconductor chip assembly system according to claim 1, wherein a rubber-elastic excursion in an axial direction of said cylindrical mouthpiece on account of said rubber-elastic region of said suction nipple can extend up to 1000 micrometers.

14. The semiconductor chip assembly system according to claim 1, wherein said suction nipple with said suction tube attachment, said rubber-elastic region and said cylindrical mouthpiece are formed in one piece from a plastic injection-molding compound.

15. The semiconductor chip assembly system according to claim 1, wherein said suction nipple is formed from an elastomeric plastic.

16. The semiconductor chip assembly system according to claim 1, wherein said suction nipple contains a thermoplastic rubber of a mixture of polypropylene and olefins.

17. The semiconductor chip assembly system according to claim 1, further comprising a lifting needle disposed opposite said cylindrical mouthpiece for removing the semiconductor chips from a carrier film, said lifting needle having a lifting range which ensures piercing of the carrier film and lifting of the semiconductor chip off the carrier film and holding of the semiconductor chip against said cylindrical mouthpiece of said suction nipple.

18. The semiconductor chip assembly system according to claim 1, wherein said suction tube attachment has an outer plug cone for fitting said suction nipple in a vacuumtight manner into a suction tube.

* * * * *